(12) United States Patent
Rankila

(10) Patent No.: US 10,388,783 B2
(45) Date of Patent: Aug. 20, 2019

(54) FLOATING-SHIELD TRIPLE-GATE MOSFET

(71) Applicant: Polar Semiconductor, LLC, Bloomington, MN (US)

(72) Inventor: Don Rankila, Farmington, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 65 days.

(21) Appl. No.: 15/045,984

(22) Filed: Feb. 17, 2016

(65) Prior Publication Data

US 2017/0236934 A1    Aug. 17, 2017

(51) Int. Cl.
| | |
|---|---|
| *H01L 29/78* | (2006.01) |
| *H01L 29/40* | (2006.01) |
| *H01L 29/423* | (2006.01) |
| *H01L 29/08* | (2006.01) |
| *H01L 29/417* | (2006.01) |

(52) U.S. Cl.
CPC ...... *H01L 29/7813* (2013.01); *H01L 29/0878* (2013.01); *H01L 29/407* (2013.01); *H01L 29/42376* (2013.01); *H01L 29/41766* (2013.01)

(58) Field of Classification Search
CPC .................................................. H01L 29/7813
USPC ................................................................ 257/330
See application file for complete search history.

(56) References Cited

U.S. PATENT DOCUMENTS

| | | | |
|---|---|---|---|
| 6,677,641 B2 | 1/2004 | Kocon | |
| 6,991,977 B2 | 1/2006 | Kocon | |
| 7,268,395 B2 | 9/2007 | Qu | |
| 7,345,342 B2 | 3/2008 | Challa et al. | |
| 7,368,777 B2 | 5/2008 | Kocon | |
| 7,638,841 B2 | 12/2009 | Challa | |
| 7,652,326 B2 | 1/2010 | Kocon | |
| 7,772,688 B2 | 8/2010 | Pan | |
| 7,893,486 B2 | 2/2011 | Hirler et al. | |
| 7,982,265 B2 | 7/2011 | Challa et al. | |
| 8,013,387 B2 | 9/2011 | Yedinak et al. | |
| 8,013,391 B2 | 9/2011 | Yedinak et al. | |
| 8,129,245 B2 | 3/2012 | Yedinak et al. | |
| 8,334,564 B2 | 12/2012 | Hirler et al. | |
| 8,759,905 B2 | 6/2014 | Hirler et al. | |
| 8,889,512 B2 | 11/2014 | Krumrey et al. | |

(Continued)

OTHER PUBLICATIONS

Franz Hirler and Holger Kapels, "YFET—Trench Superjunction Process Window extended", Infineon Technologies AF, AM Campeon 1-12, IEEE 2009, pp. 299-302.

*Primary Examiner* — Hsin Yi Hsieh
(74) *Attorney, Agent, or Firm* — Kinney & Lange, P.A.

(57) ABSTRACT

Apparatus and associate methods relate to a high-voltage MOSFET bounded by two trenches, each having dielectric sidewalls and a dielectric bottom isolating a top field plate and a bottom field plate. The top field plate is electrically connected to a biasing circuit net, and the bottom field plate is biased via a capacitive coupling to the top field plate. The upper field plate and lower field plate are configured to deplete the majority carriers in a drain region of the MOSFET bounded by the two trenches so as to equalize two local maxima of an electric field induced by a drain/body bias, the two local maxima located proximate a drain/body metallurgical junction and proximate a trench bottom. The two local maxima of the electric field are equalized by controlling a depth location of an intervening dielectric between the upper field plate and the lower field plate.

13 Claims, 8 Drawing Sheets

(56) References Cited

U.S. PATENT DOCUMENTS

| | | | |
|---|---|---|---|
| 8,899,511 B2 | 11/2014 | Takahashi | |
| 8,936,985 B2 | 1/2015 | Challa et al. | |
| 2005/0275016 A1* | 12/2005 | Qu | H01L 29/407 257/342 |
| 2007/0114600 A1* | 5/2007 | Hirler | H01L 29/407 257/330 |

* cited by examiner

FLOATING-SHIELD TRIPLE-GATE MOSFET

BACKGROUND

Power MOSFETs are a type of Metal Oxide Semiconductor Field Effect Transistor (MOSFET) that is designed to handle significant power levels. Some of these devices are designed to switch high currents and to have low on resistance. Some of these devices are designed to tolerate high voltages across the device's terminals. The voltage tolerance and current requirements have resulted in device configurations different from traditional MOSFET designs. One such device configuration involves trenches, which have been used to provide vertical channel conduction for such power MOSFETS.

Some of these high-voltage power MOSFETS are manufactured using trenches that have dielectric sidewalls and a dielectric bottom isolating a field plate within the trench from surrounding semiconductor material. The field plate can be biased to deplete majority carriers from the surrounding semiconductor material. Some trench MOSFETS are manufactured between closely spaced field plates that reside in closely spaced trenches. In such cases, the semiconductor material between these closely spaced trenches can be substantially depleted of majority carriers throughout. When the semiconductor material is so depleted of majority carriers, a high-voltage drain bias can be distributed across the depletion regime so that the drain/body interface is not exposed to an excessive voltage—a voltage that can cause avalanche breakdown.

SUMMARY

Apparatus and associated methods relate to a trench MOSFET including a semiconductor die that has a substrate, an active device region formed upon the substrate, and an interconnection region formed upon the active device region. The active device region and the interconnection region are separated by an interface surface. The trench MOSFET includes a pair of adjacent trenches formed in the active device region, each of the adjacent trenches extending from the interface surface to a dielectric trench bottom. The adjacent trenches are laterally separated from one another by an intervening semiconductor region. The trench MOSFET includes a conductive gate located within each of the trenches and separated from the intervening semiconductor region by a dielectric gate sidewall. The trench MOSFET includes a first conductive field plate located within each of the trenches. The first conductive field plate is electrically connected to a biasing circuit net in the interconnection region. The first conductive field plate extends a vertical distance below the conductive gate. The first conductive field plate is laterally separated from the intervening semiconductor region by a dielectric trench sidewall. The trench MOSFET includes a second conductive field plate located within each of the trenches. The second conductive field plate extends below the first conductive field plate and is separated from the first conductive field plate by an intervening dielectric. The second conductive field plate is floated but capacitively coupled via the intervening dielectric to the first conductive field plate. The second conductive field plate is laterally separated from the intervening semiconductor region by the dielectric trench sidewall. The trench MOSFET includes a source region in the intervening semiconductor region, the source region abutting each of the trenches. The trench MOSFET includes a body region in the intervening semiconductor region, the body region abutting the dielectric gate sidewall of each of the trenches. The trench MOSFET also includes a drain region contiguously extending from the body region to the substrate region.

In some embodiments, a method of reducing a maximum electric field in a trench MOSFET includes conductively biasing an upper field plate within each of two adjacent trenches. The method includes capacitively biasing a lower field plate within each of the two adjacent trenches via the corresponding upper field plate. The method includes depleting majority carriers from an upper intervening drain region between the two adjacent trenches via a field produced by the conductively biased upper field plates. The method also includes depleting majority carriers from a lower intervening drain region between the two adjacent trenches via a field produced by the capacitively biased lower field plates. The upper field plate and lower field plate are configured to deplete the majority carriers in the upper intervening drain region and lower intervening drain region, respectively, so as to equalize two local maxima of an electric field induced by a drain/body bias, the two local maxima located proximate a drain/body metallurgical junction and proximate a trench bottom.

In an exemplary embodiment, a trench MOSFET includes a semiconductor die having a lower substrate region, an intermediate active region, and an upper interconnection region. The intermediate active region has a top interface surface delineating a plane separating the intermediate active region from the upper interconnection region. Formed in the intermediate active region is an alternating series of semiconductor pillars and longitudinal trenches. Each of the semiconductor pillars has a source region, a body region, and a drain region. Each of the longitudinal trenches vertically extends from the top interface surface to a trench bottom. Each longitudinal trench has conductive gates on either of two lateral ends, the conductive gates separated from the body regions of adjacent semiconductor pillars by a gate dielectric. Each longitudinal trench has an upper conductive field plate and a lower conductive field plate. The upper and lower conductive field plates are separated from the drain regions of adjacent semiconductor pillars by dielectric sidewalls. The upper and lower field plates in each trench are vertically aligned to one another. The upper field plate is biased by electrical conduction with a circuit net in the upper interconnection region. The lower field plate is floated and capacitively coupled to the upper field plate.

DETAILED DESCRIPTION

Field plate containing trenches can be formed in an active device region to horizontally separate the active device region into relatively small parcels of semiconductor real estate. These field plates can be electrically isolated from the adjacent parcels of semiconductor real estate by dielectric trench sidewalls and a dielectric trench bottom. These field plates then can be biased to act as a conductive plate of a capacitor influencing carrier populations in the adjacent parcels of semiconductor real estate. By appropriately biasing the conductive field plates with respect to the surrounding active device regions, majority carriers can be substantially depleted from a drift region of a MOSFET's drain. If adjacent trenches are located close to one another, a MOSFET's drain formed therebetween can be depleted of majority carriers throughout. Depleting the majority carriers from such a MOSFET's drain can facilitate control of the voltage drop within such a depletion region. By controlling the voltage drop in the MOSFET's drain, a voltage drop across the drain/body metallurgical junction can be maintained below a critical voltage that could otherwise cause avalanche breakdown.

Figure 1:
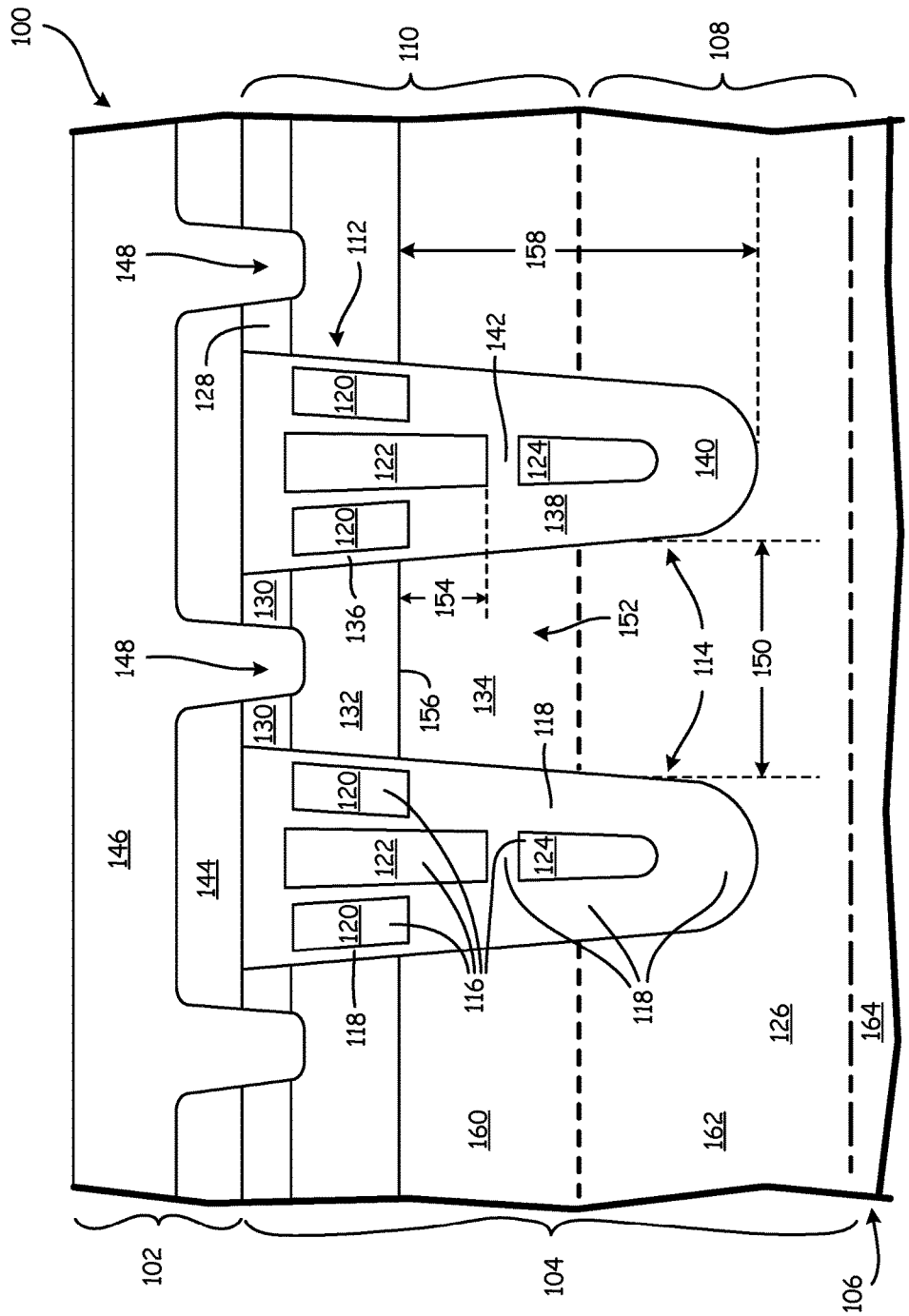
FIG. 1 depicts a cross-sectional view of an exemplary split-gate trench MOSFET with floating shield.

FIG. 1 depicts a cross-sectional view of an exemplary split-gate trench MOSFET with a floating shield. In FIG. 1, semiconductor device 100 has been cross-sectioned to show interconnection region 102 and active device region 104 upon substrate 106. Active device region 104 is formed in first epitaxial layer 108 and second epitaxial layer 110. Trench MOSFET 112 is formed in active device region 104 between two adjacent trenches 114. Each of trenches 114 includes conductive features 116 and dielectric features 118. Conductive features 116 include MOSFET gates 120, upper field plate 122, and lower field plate 124. Each of conductive features 116 is isolated from semiconductor 126 of active device region 104 outside of trenches 114. In some embodiments conductive features 116 can be formed by depositing polysilicon, for example. Dielectric features 118 include gate dielectric 136, dielectric trench sidewalls 138, dielectric trench bottom 140, and field plate dielectric 142. Dielectric features 118 can be formed by growing and/or depositing an oxide and/or a nitride in some embodiments (e.g., silicon dioxide).

In FIG. 1, trench MOSFET 112 is oriented vertically, which means that the general direction of current flow is directed between semiconductor top surface 128 and substrate 106 below. This general direction of current flow results from the vertical arrangement of source 130, body 132, and drain 134 of trench MOSFET 112. MOSFET gates 120 control channel conductivity within body 132 of trench MOSFET 112. MOSFET gates 120 are electrically isolated from MOSFET body 132 via gate dielectric 136. Upper and lower field plates 122, 124 are electrically isolated from semiconductor 126 via dielectric trench sidewalls 138 and dielectric trench bottom 140. Upper and lower field plates 122, 124 are electrically isolated one from another via field plate dielectric 142.

Interconnection region 102 includes dielectric layer 144 and conductive layer 146. Conductive layer 146 can be formed by depositing a metal material, such as, for example, aluminum, titanium, tungsten, copper, gold, or other metal. In some embodiments, conductive layer 146 can be formed by depositing a polysilicon layer. In the FIG. 1 depiction, conductive layer 146 has contacts 148 that electrically connect conductive layer 146 to semiconductor 126. Contacts 148 electrically connect MOSFET sources 130 and MOSFET bodies 132 to conductive layer 146. Conductive layer 146 can be patterned such that separate circuit nets are created. In FIG. 1, separate circuit nets are not depicted and the illuminated portion of conductive layer 146 pertains to a single circuit net—in this case a MOSFET source/body net.

The particular juxtaposition of features shown in FIG. 1 has purpose. Trenches 114 are separated one from another at separation distance 150. Separation distance 150 is also the width of intervening semiconductor pillar 152 of semiconductor 126. Upper field plate 122 extends distance 154 below body/drain interface 156. Dielectric trench bottom 140 extends distance 158 below body/drain interface 156. Each of distances 150, 154, 158 are established for a purpose. Semiconductor pillar width 150 is less than a predetermined maximum width that can be depleted of majority carriers under certain predetermined bias conditions. Distances 154, 158 are established to minimize a maximum electric field in semiconductor 126 under a predetermined maximum bias condition.

Upper field plates 122 can be electrically biased via a contact (not depicted) to provide electrical connection to a biasing node, such as, for example, MOSFET source 130 and/or MOSFET body 132. In some embodiments, upper field plates 122 can be electrically connected to MOSFET sources 130 and/or MOSFET bodies 132, for example. Lower field plates 124 can be floated or electrically isolated from upper field plates 122 and/or semiconductor 126. Lower field plates 124 are capacitively coupled, however, to both upper field plates 122 and surrounding semiconductor 126.

Lower field plates 124 are capacitively coupled to upper field plates 122 primarily via field plate dielectric 142, for example. Lower field plates 124 are capacitively coupled to semiconductor 126 via dielectric trench sidewalls 138 and dielectric trench bottom 140. A coupling ratio of lower field plate/upper field plate capacitance to lower field plate/semiconductor capacitance can be controlled via control of thicknesses of field plate dielectric 142, dielectric trench sidewalls 138 and dielectric trench bottom 140.

MOSFET drain 134 includes three separate regions, including upper drain region 160, intermediate drain region 162 and lower drain region 164. Upper drain region 160 is formed in second epitaxial layer 110. Intermediate drain region 162 is formed in first epitaxial layer 108. Lower drain region 164 is formed in substrate 106. Upper, intermediate, and lower drain regions 160, 162, 164 form a contiguous junctionless MOSFET drain 134 (indicated by dashed lines of separation). In some embodiments, dopant concentration levels in intermediate drain region 162 are lower than dopant concentration levels in upper drain region 160 and/or dopant concentration levels in lower drain region 164. Such dopant concentration levels may minimize a drain resistance under certain bias conditions.

As semiconductor pillar width 150 is reduced, higher dopant concentration levels may be used in upper drain region 160. This results from an increased ability of upper field plates 122 to deplete majority carriers from intervening semiconductor pillars 152 as width 150 is decreased. Upper field plates 122 on either side of semiconductor pillar 152 need only deplete carriers from a proximal half of semiconductor pillar 152 located near upper field plates 122. A distal half of semiconductor pillar 152 located near upper field plate 122 of adjacent trench 140 will deplete majority carriers from that half. Thus, as width 150 is decreased, a lateral depletion depth can correspondingly be reduced as dopant concentration level is increased.

Lower field plate 124 controls the depletion of majority carriers in regions of semiconductor 126 proximate to lower field plate 124. For example, lower field plate 124 controls depletion of majority carriers in intermediate drain region 162. There are at least three differences between upper drain region 160 and intermediate drain region 162 that can result in different biasing of field plates 122, 124 in those regions 160, 162. One, upper drain region 160 and intermediate drain region 162 can have different dopant concentrations. Two, upper drain region 160 and lower drain region 162 can have different voltage levels. Three, dielectric trench bottom 140 can have an enhanced electric field resulting from a curvature at the interface between dielectric trench sidewalls 138 and dielectric trench bottom 140. These differences, and perhaps others, can give rise to an optimal biasing of bottom field plate 124 that is different from an optimal biasing of top field plate 122. This biasing of bottom field plate 124 can be capacitively controlled and bottom field plate 124 need not be electrically connected to a biasing circuit net.

Figure 2:
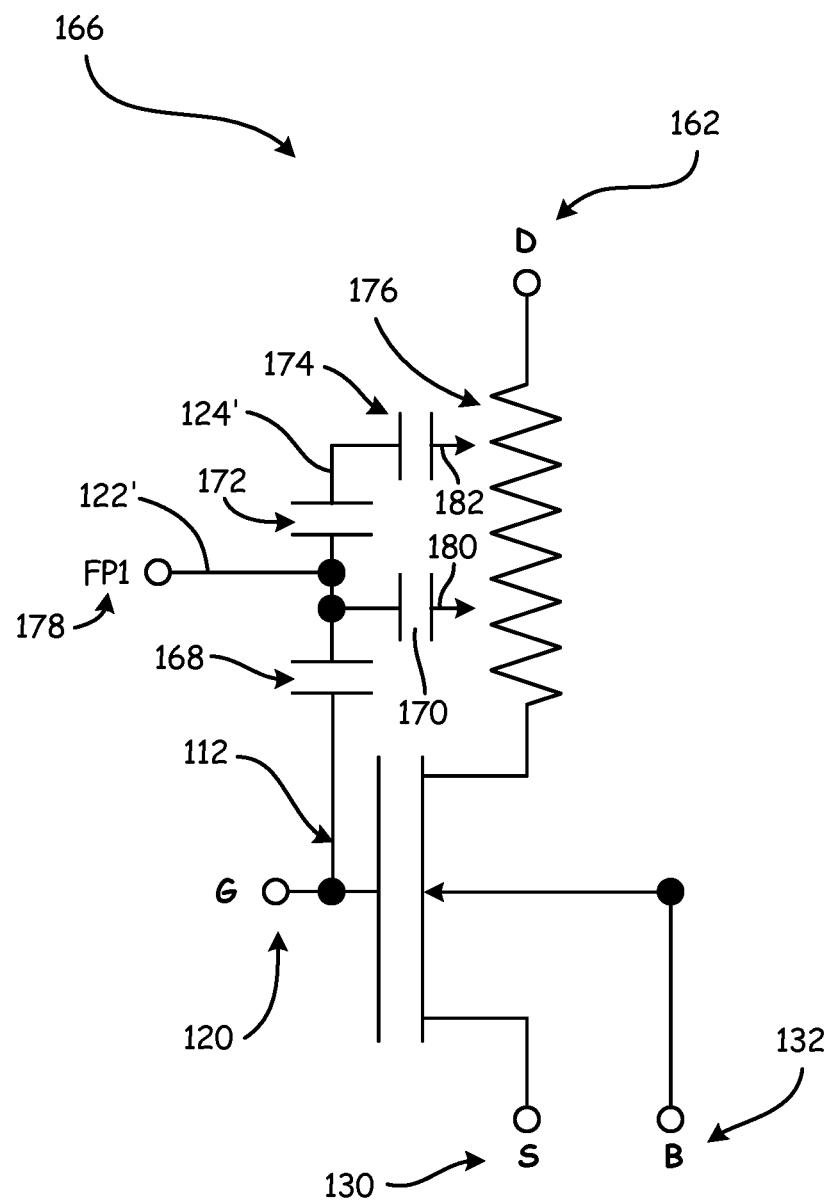
FIG. 2 depicts a schematic representation of an exemplary split-gate trench MOSFET with floating gate.

FIG. 2 depicts a schematic representation of an exemplary split-gate trench MOSFET with floating gate. In FIG. 2, circuit schematic 166 corresponding to the structures shown in FIG. 1 is shown. The circuit schematic 166 includes MOSFET 112, top field plate/gate capacitor 168, top field plate/drain region capacitor 170, top field plate/bottom field plate capacitor 172, bottom field plate/drain region capacitor 174, and drain resistor 176. In circuit schematic 166, upper field plate 122 is represented as circuit net 122' with biasing contact 178. Lower field plate 124 is represented as circuit net 124' connecting top field plate/bottom field plate capacitor 172 to bottom field plate/drain region capacitor 174. Each of top field plate/drain region capacitor 170 and bottom field plate/drain region capacitor 174 has resistor wiper, 180, 182, respectively. Each of resistor wipers 180, 182 points to an location of drain resistor 176 at which top and bottom field plate/drain region capacitors 170, 174 is effectively coupled to drain resistor 176.

The value of top field plate/drain region capacitor 170 changes as a function of distance 154—that is the distance that upper field plate 122 extends below the drain/body junction depth location (shown in FIG. 1). The location of resistor wiper 180 also changes in response to changes in distance 154. The value of bottom field plate/drain region capacitor 174 also changes as a function of distance 154, as does resistor wiper 182. Thus, depth location 154 of top field plate/bottom field plate capacitor 172 changes resistor and capacitor values of circuit schematic 166. These resistor and capacitor values can be controlled so as to minimize a peak electric field in the drain regions 160, 162 of MOSFET 112.

Figure 3A:
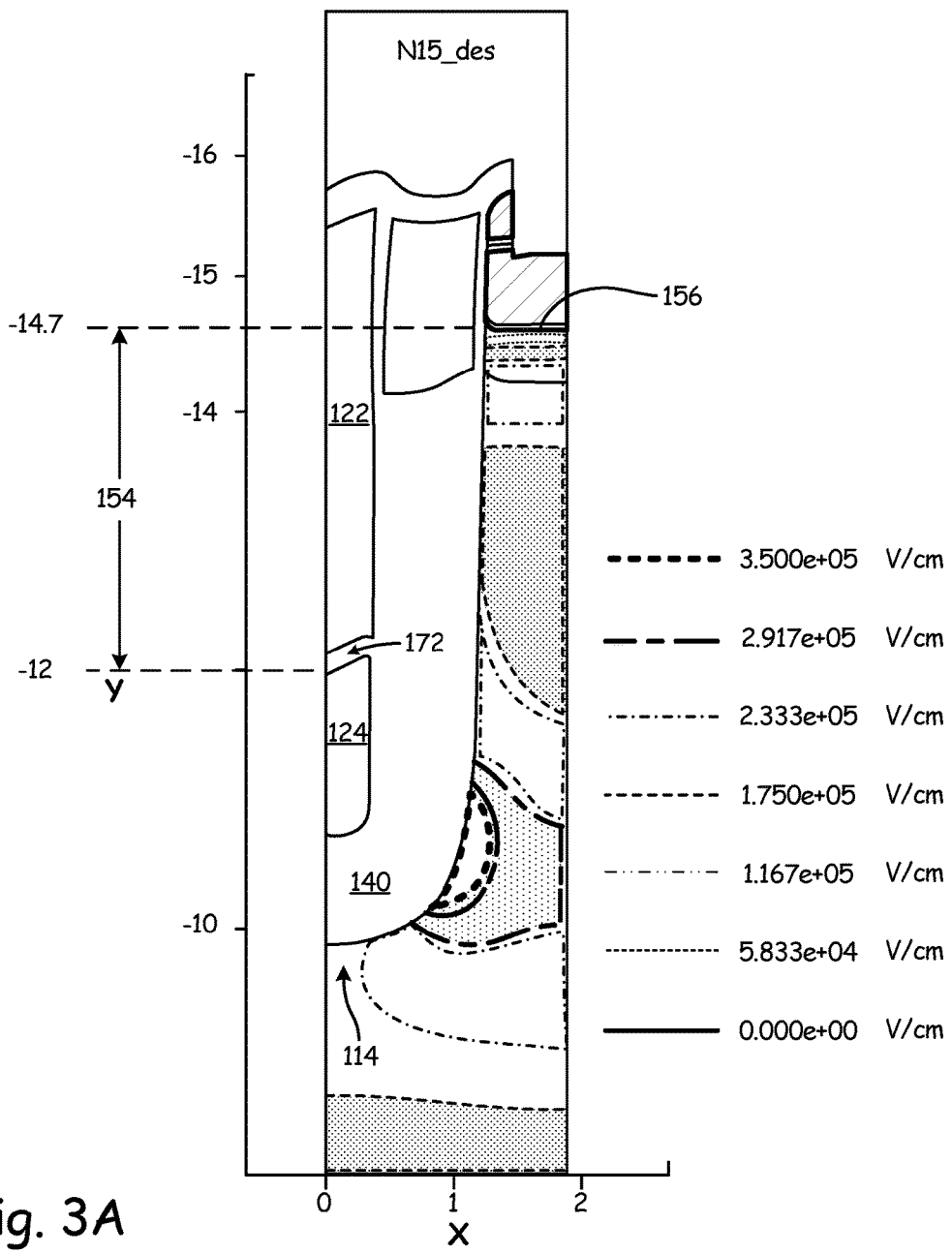
FIGS. 3A-3C depict cross-sectional views of an exemplary split-gate trench MOSFET annotated with electric field contour lines.
Figure 3B:
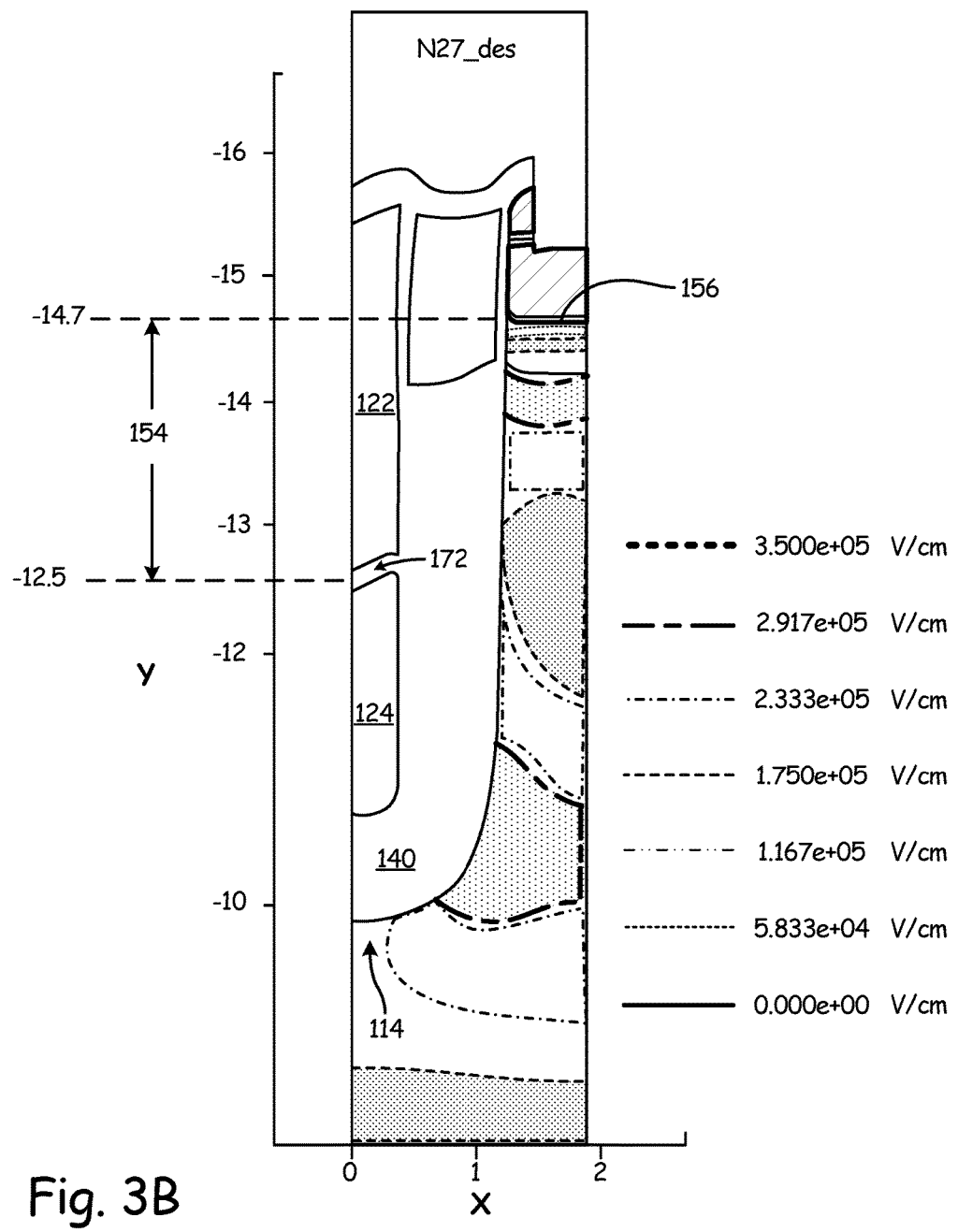
Figure 3C:
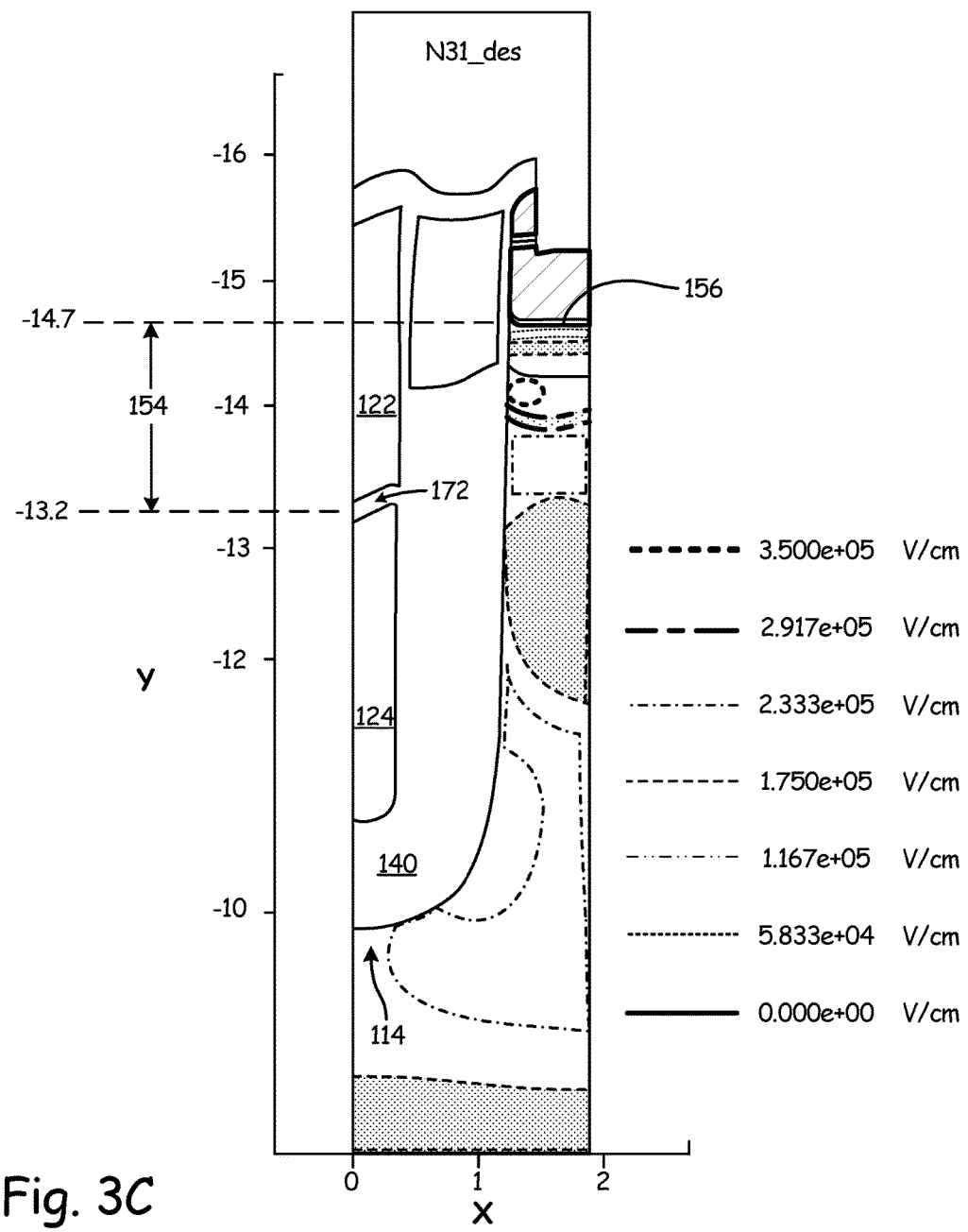

FIGS. 3A-3C depict cross-sectional views of an exemplary split-gate trench MOSFET annotated with electric field contour lines. Each of FIGS. 3A-3C depicts an exemplary split-gate trench MOSFET having different geometries of top field plate 122 and bottom field plate 124. In the FIG. 3A depiction, top field plate/bottom field plate capacitor 172 depth location 154 is relatively deep—approximately 2.7 microns below drain/body interface 156. Lines of equal-electric-fields are annotated on FIGS. 3A-3C. A maximum electric field in FIG. 3A is near dielectric trench bottom 140 of trench 114. The maximum electric field line is around $3.5 \times 10^5$ volts/cm. Such a large electric field is greater than the critical field of about $3.0 \times 10^5$ volts/cm above which avalanche breakdown can occur.

In FIG. 3B, depth location 154 of top field plate/bottom field plate capacitor 168 is shallower than in FIG. 3A, approximately 2.0 microns below drain/body interface 156. The electric field profile in FIG. 3B has two local maximums, one proximate drain/body interface 156 and one proximate dielectric trench bottom 140. A magnitude of each of these local maximums is approximately equal to each other. The maximum electric field in FIG. 3B is less than $3.0 \times 10^5$ volts/cm. Because the maximum electric field in FIG. 3B is less than the critical field, avalanche breakdown should not occur for these bias conditions.

In FIG. 3C, depth location 154 of top field plate/bottom field plate interface 156 is still shallower than in FIG. 3B, approximately 1.5 microns below drain/body interface 156. The electric field profile in FIG. 3C again has two local maximums, one proximate drain/body interface 156 and one proximate dielectric trench bottom 140. A magnitude of the local maximum proximate drain/body interface 156 is much greater than a magnitude of the local maximum proximate dielectric trench bottom 140. The magnitude of the local maximum proximate drain/body interface 156 is approximately $3.5 \times 10^5$ volts/cm. This is again above the critical electric field of about $3.0 \times 10^5$ volts/cm.

Figure 4:
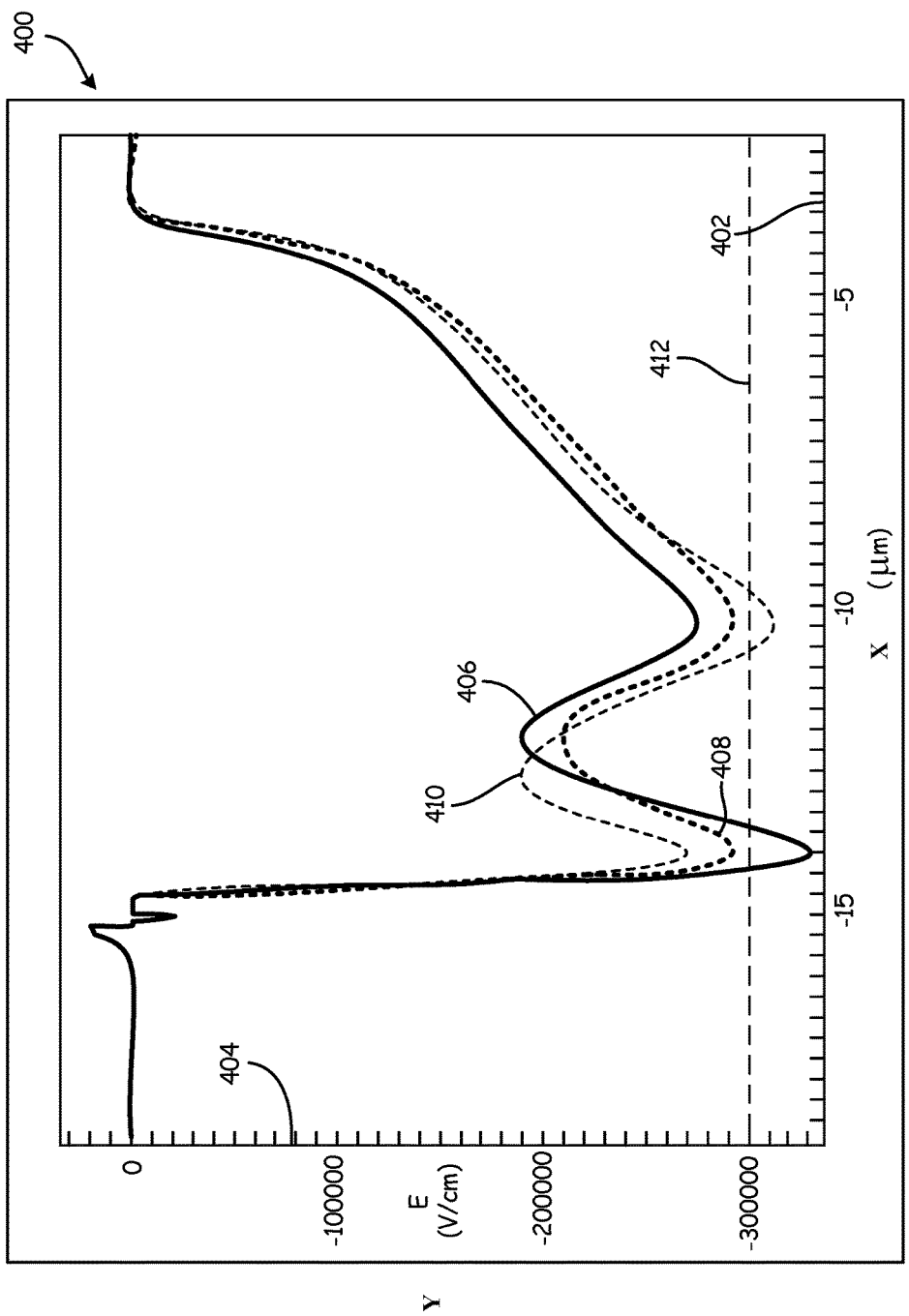
FIG. 4 depicts a graph of a magnitude of the electric field vs. a depth location within an exemplary trench MOSFET.

FIG. 4 depicts a graph of a y-component of the electric field vs. a depth location within an exemplary trench MOSFET. In FIG. 4, the y-component of the electric field measured at a center of the semiconductor pillar is graphed as a function of vertical depth location. Graph 400 includes horizontal axis 402, vertical axis 404, electric field/depth location relations 406, 408, 410, and electric field breakdown threshold 412. Electric field/depth location relation 406 corresponds to simulation results depicted in FIG. 3A. Electric field/depth location relation 408 corresponds to simulation results depicted in FIG. 3B. Electric field/depth location relation 410 corresponds to simulation results depicted in FIG. 3C.

Wherever electric field/depth location relation 406, 408, 410 exceeds electric field breakdown threshold 412, a semiconductor device having such a relation risks catastrophic breakdown. Note that electric field/depth location relation 406 exceeds electric field breakdown threshold 412 at a depth location of around −13.5 microns. Electric field/depth location relation 410 also exceeds electric field breakdown threshold 412, but at a depth location around −10.5 microns. Only electric field/depth location relation 408 does not exceed electric field breakdown threshold 412. Thus, the breakdown voltage of a device having electric field/depth location relation 408 will be greater than devices having either of electric field/depth location relations 406, 410.

Figure 5:
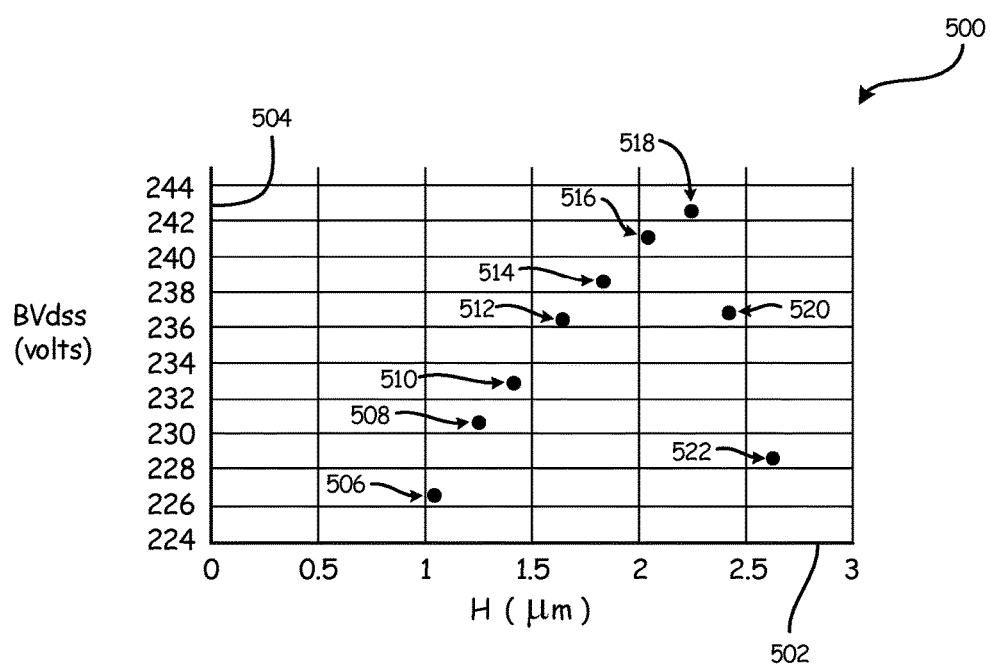
FIG. 5 depicts a graph of breakdown voltage vs. height of floating gate for an exemplary split-gate trench MOSFET with floating shield.

FIG. 5 depicts a graph of breakdown voltage vs. height of floating gate for an exemplary split-gate trench MOSFET with a floating shield. In FIG. 5, graph 500 includes horizontal axis 502, vertical axis 504 and simulation results 506, 508, 510, 512, 514, 516, 518, 520, 522. Each of simulation results 506, 508, 510, 512, 514, 516, 518, 520, 522 corresponds to a different geometry of top and bottom field plates 122, 124. In graph 500, horizontal axis 502 represents a vertical dimension of bottom field plate 124. As the vertical dimension of bottom field plate 124 increases, a vertical dimension of top field plate 122 correspondingly decreases. In graph 500, vertical axis 504 represents breakdown voltage, BVDSS, resulting from a voltage bias between MOSFET drain 134 and MOSFET source 130, with MOSFET gate 120 and MOSFET body 132 shorted to MOSFET source 130.

Graph 500 shows the simulated relationship between BVDSS and the vertical dimension of bottom field plate 124. Simulation result 506 depicts one such data point in which the vertical dimension is 1.0 micron. When the vertical dimension of bottom field plate 124 is 1.0 micron, the vertical dimension of top field plate 122 is approximately 3.6 microns, in this embodiment simulated. When the vertical dimension of bottom field plate 124 is 1.0 micron, BVDSS is approximately 226 volts. But as the vertical dimension of bottom field plate 124 increases from 1 micron to 1.2, 1.4, 1.6, 1.8, 2.0, and to 2.2 microns, represented by simulation results 506, 508, 510, 512, 514, 516, and 518 respectively, BVDSS increases from 226 to 230, 234, 236, 239, 242, and to 243 respectively. But further increases in the vertical dimension of bottom field plate 124 from 2.2 to 2.4 and to 2.6, represented by simulation results 518, 520, and 522 respectively, result in decreasing values of BVDSS from 243 to 237 and to 228, respectively.

A maximum value of BVDSS is obtained in the example shown when the vertical dimension of bottom field plate 124 is approximately 2.2 microns. It is at such an optimal value of the vertical dimension that the simulation results depicted in FIG. 3B correspond. At such an optimal value of the vertical dimension of bottom field plate 124, the two high electric field regions depicted in FIG. 3B are approximately equal in magnitude.

Figure 6:
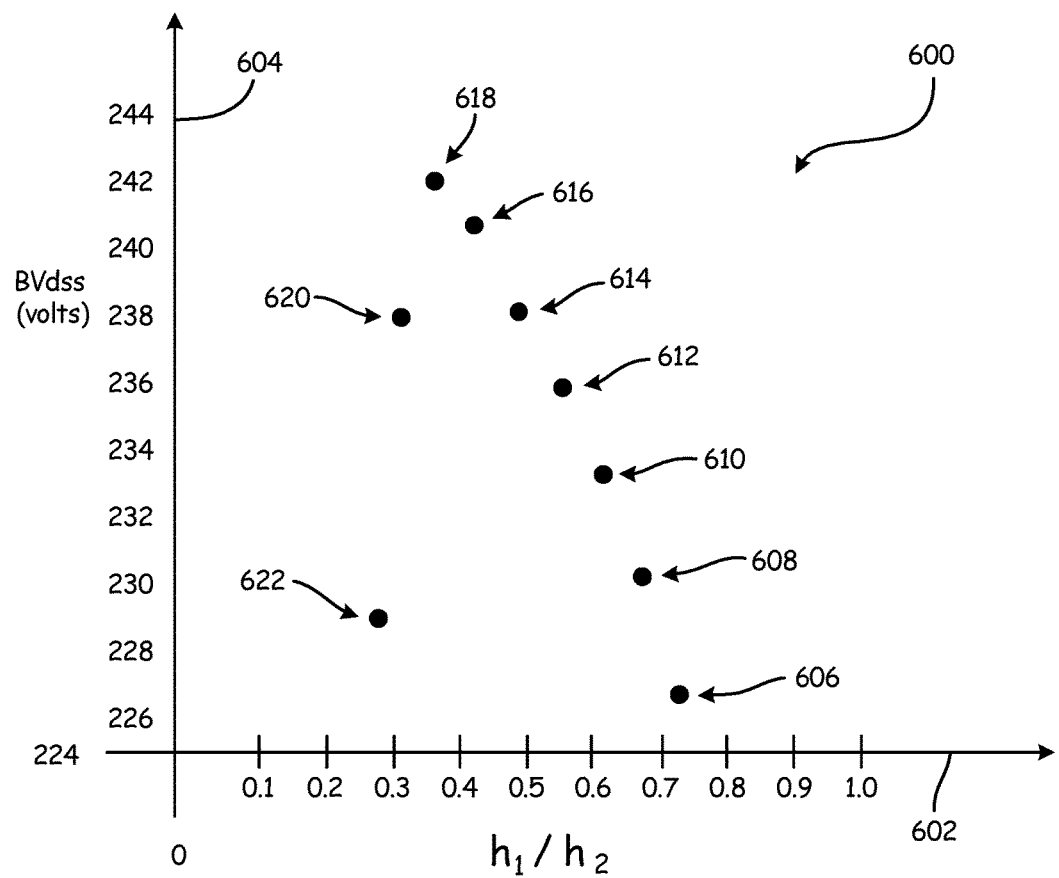
FIG. 6 depicts a graph of breakdown voltage vs. ratio of floating gate height to semiconductor pillar height for an exemplary split-gate trench MOSFET with floating shield.

FIG. 6 depicts a graph of breakdown voltage vs. ratio of floating gate height to semiconductor pillar height for an exemplary split-gate trench MOSFET with floating shield. In FIG. 6, graph 600 represents the same simulation data as is depicted in graph 500 of FIG. 5, but using a different independent variable. Graph 600 plots BVDSS versus a ratio of dimensions, while graph 500 plots BVDSS versus the vertical dimension of bottom field plate 124. Graph 600 includes horizontal axis 602, vertical axis 604 and simulation results 606, 608, 610, 612, 614, 616, 618, 620, 622. Each of simulation results 606, 608, 610, 612, 614, 616, 618, 620, 622 corresponds to a different geometry of top and bottom field plates 122, 124. Simulation results 606, 608, 610, 612, 614, 616, 618, 620, and 622 represent that data points corresponding to simulation results 506, 508, 510, 512, 514, 516, 518, 520 and 522, respectively.

In graph 600, horizontal axis 602 represents a ratio of a vertical distance from drain/body interface 156 to top field plate/bottom field plate capacitor 168 to a vertical distance from drain/body interface 156 to dielectric trench bottom 140. The denominator of this ratio is approximately the separation distance between the two high electric field regions depicted in FIGS. 3A-3C. The numerator of this ratio is the vertical distance from the high electric field region near drain/body interface 156 to the dielectric break between top field plate 122 and bottom field plate 124. Thus the ratio represents the fraction of the vertical distance between the two high electric field regions that is controlled or influenced by top field plate 122. In graph 600, vertical axis 604 represents breakdown voltage, BVDSS, resulting from a voltage bias between MOSFET drain 134 and MOSFET source 130, with MOSFET gate 120 and MOSFET body 132 shorted to MOSFET source 130.

Graph 600 shows the simulated relationship between BVDSS and the ratio as defined above. Simulation result 606 depicts one such data point in which this ratio of vertical distances is approximately 0.75. When the vertical distance ratio is 0.75, BVDSS is approximately 226 volts. But as the vertical distance ratio decreases from 0.75 to 0.67, 0.60, 0.53, 0.46, 0.40, and to 0.34, represented by simulation results 606, 608, 610, 612, 614, 616, and 618 respectively, BVDSS increases from 226 to 230, 234, 236, 239, 242, and to 243 respectively. But further decreases in the vertical distance ratio from 0.34 to 0.30 and to 0.25, represented by simulation results 618, 620, and 622 respectively, result in decreasing values of BVDSS from 243 to 237 and to 228, respectively.

A maximum value of BVDSS is obtained when the vertical distance ratio is between 0.3 and 0.7, in this embodiment. In a particular exemplary embodiment, a maximum value of BVDSS is obtained when the vertical distance ratio is between 0.4 and 0.6. It is at such an optimal value of the vertical distance ratio that the simulation results depicted in FIG. 3B correspond. At such an optimal value of the vertical distance ratio, the two high electric field regions depicted in FIG. 3B are approximately equal in magnitude.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A trench MOSFET comprising:
   a semiconductor die including a substrate, an active device region formed upon the substrate, and an interconnection region formed upon the active device region, the active device region and the interconnection region separated by an interface surface;
   a pair of trenches formed in the active device region, each of the trenches extending from the interface surface to a dielectric trench bottom, the pair of trenches laterally separated from one another by an intervening semiconductor pillar;
   a conductive gate located within each of the trenches and separated from the intervening semiconductor pillar by a gate dielectric;
   a first conductive field plate located within each of the trenches, the first conductive field plate electrically connected to a biasing circuit net in the interconnection region, the first conductive field plate extending to a first depth location below the conductive gate, the first conductive field plate laterally separated from the intervening semiconductor pillar by a dielectric trench sidewall;
   a second conductive field plate located within each of the trenches, the second conductive field plate extending to a second depth location below the first conductive field plate and separated from the first conductive field plate by an intervening dielectric layer, the second conductive field plate floated but capacitively coupled via the intervening dielectric layer to the first conductive field plate, the second conductive field plate laterally separated from the intervening semiconductor pillar by the dielectric trench sidewall;
   a source region in the intervening semiconductor pillar, the source region abutting each of the trenches;
   a body region in the intervening semiconductor pillar, the body region abutting each of the trenches; and
   a drain region in the intervening semiconductor pillar contiguously extending from the body region to the substrate, wherein the drain region has a dopant concentration that varies from a drain/body interface to the substrate,
   wherein configuration of the first and second conductive field plates, the intervening dielectric layer, the dielectric trench sidewall, and the dopant concentration in the drain region causes, under predetermined maximum bias conditions, first and second local maxima of the electric field in the drain region located proximate the drain/body interface and the dielectric trench bottom, respectively, to be substantially equal in magnitude.

2. The trench MOSFET of claim 1, wherein a lateral distance separates the pair of trenches and defines a width of the intervening semiconductor pillar, the lateral distance being less than a predetermined distance such that when the drain region is biased to a first specified voltage and the first conductive field plate is biased to a second specified voltage, the drain region between the pair of trenches is depleted of majority carriers throughout the lateral distance.

3. The trench MOSFET of claim 1, wherein the source region is discontiguous in the intervening semiconductor pillar.

4. The trench MOSFET of claim 1, wherein the drain region contiguously extends from the body region to the substrate and is junctionless from the body region to the substrate.

5. The trench MOSFET of claim 1, wherein the intervening semiconductor pillar extends a first vertical distance from the drain/body interface to a third depth location laterally adjacent to the dielectric trench bottom is separated into an upper field-plate controlled portion and a lower field-plate controlled portion, the upper field-plate controlled portion vertically extending a second vertical distance from the drain/body interface to a fourth depth location laterally adjacent to a bottom of the first conductive field plate, the lower field-plate controlled portion vertically extending a third vertical distance from the fourth depth location to a fifth depth location laterally adjacent to a bottom of the second conductive field plate.

6. The trench MOSFET of claim 5, wherein a ratio of the second vertical distance to the first vertical distance is between 0.3 and 0.7.

7. The trench MOSFET of claim 6, wherein a ratio of the second vertical distance to the first vertical distance is between 0.4 and 0.6.

8. The trench MOSFET of claim 1, wherein the body region is electrically connected to the biasing circuit net.

9. The trench MOSFET of claim 1, wherein the source region is electrically connected to the biasing circuit net.

10. A trench MOSFET comprising:
a semiconductor die having a lower substrate region, an intermediate active region, and an upper interconnection region, the intermediate active region having a top interface surface delineating a plane separating the intermediate active region from the upper interconnection region, wherein the intermediate active region is formed of alternating series of semiconductor pillars and longitudinal trenches,
wherein each of the semiconductor pillars has a source region, a body region, and a drain region contiguously extending form the body region to the lower substrate region, wherein the drain region has a dopant concentration that varies from a drain/body interface to the lower substrate region, and
wherein each of the longitudinal trenches vertically extends from the top interface surface to a dielectric trench bottom, each of the longitudinal trenches having conductive gates on either of two lateral ends, the conductive gates separated from the body regions of adjacent semiconductor pillars by a gate dielectric, each of the longitudinal trenches having an upper conductive field plate and a lower conductive field plate, the upper and lower conductive field plates separated from the drain regions of adjacent semiconductor pillars by dielectric sidewalls, the upper and lower conductive field plates in each of the longitudinal trenches vertically aligned to one another, the upper conductive field plate being biased by electrical conduction with a circuit net in the upper interconnection region, the lower conductive field plate floated and capacitively coupled via an intervening dielectric layer to the upper conductive field plate,
wherein configuration of the upper and lower conductive field plates, the intervening dielectric layer, the dielectric sidewall, and the dopant concentration in the drain region causes, under predetermined maximum bias conditions, first and second local maxima of the electric field in the drain region located proximate the drain/body interface and the dielectric trench bottom, respectively, to be substantially equal in magnitude.

11. The trench MOSFET of claim 10, wherein the drain region of each of the semiconductor pillars extends a first vertical distance from the drain/body interface to a first depth location laterally adjacent to the dielectric trench bottom of each of the longitudinal trenches, the drain region separated into an upper field-plate controlled portion and a lower field-plate controlled portion, the upper field-plate controlled portion vertically extending a second vertical distance from the drain/body interface to a second depth location laterally adjacent to a bottom of the upper conductive field plate, the lower field-plate controlled portion vertically extending a third vertical distance from the second depth location laterally adjacent to the bottom of the upper conductive field plate to a third depth location laterally adjacent to a bottom of the lower conductive field plate.

12. The trench MOSFET of claim 11, wherein a ratio of the second vertical distance to the first vertical distance is between 0.3 and 0.7.

13. The trench MOSFET of claim 11, wherein a ratio of the second vertical distance to the first vertical distance is between 0.4 and 0.6.

* * * * *